United States Patent
Klimov et al.

(10) Patent No.: US 7,642,557 B2
(45) Date of Patent: Jan. 5, 2010

(54) NON-CONTACT PUMPING OF LIGHT EMITTERS VIA NON-RADIATIVE ENERGY TRANSFER

(75) Inventors: Victor I. Klimov, Los Alamos, NM (US); Marc Achermann, Los Alamos, NM (US)

(73) Assignee: Los Alamos National Security, LLC, Los Alamos, NM (US)

( * ) Notice: Subject to any disclaimer, the term of this patent is extended or adjusted under 35 U.S.C. 154(b) by 0 days.

(21) Appl. No.: 10/843,737

(22) Filed: May 11, 2004

(65) Prior Publication Data

US 2005/0253152 A1 Nov. 17, 2005

(51) Int. Cl.
*H01L 27/15* (2006.01)

(52) U.S. Cl. ................ 257/79; 257/E33.001

(58) Field of Classification Search .......... 257/79, 257/103, E33.001; 428/325
See application file for complete search history.

(56) References Cited

U.S. PATENT DOCUMENTS

| | | | | |
|---|---|---|---|---|
| 5,354,707 | A * | 10/1994 | Chapple-Sokol et al. | 438/24 |
| 6,160,828 | A * | 12/2000 | Kozlov et al. | 372/39 |
| 6,426,513 | B1 * | 7/2002 | Bawendi et al. | 257/13 |
| 6,608,439 | B1 * | 8/2003 | Sokolik et al. | 313/512 |
| 7,150,910 | B2 * | 12/2006 | Eisler et al. | 428/325 |
| 2003/0143427 | A1 * | 7/2003 | Matsuo et al. | 428/690 |
| 2005/0001224 | A1 * | 1/2005 | Chen | 257/98 |

OTHER PUBLICATIONS

"Encyclopedia of Laser Physics and Technology" 'Distributed feedback lasers' http://www.rp-photonics.com/distributed_feedback_lasers.html.*

* cited by examiner

*Primary Examiner*—Mark Prenty
(74) *Attorney, Agent, or Firm*—Bruce H. Cottrell; Juliet A. Jones (57) ABSTRACT

A light emitting device is disclosed including a primary light source having a defined emission photon energy output, and, a light emitting material situated near to said primary light source, said light emitting material having an absorption onset equal to or less in photon energy than the emission photon energy output of the primary light source whereby non-radiative energy transfer from said primary light source to said light emitting material can occur yielding light emission from said light emitting material.

35 Claims, 6 Drawing Sheets

NON-CONTACT PUMPING OF LIGHT EMITTERS VIA NON-RADIATIVE ENERGY TRANSFER

STATEMENT REGARDING FEDERAL RIGHTS

This invention was made with government support under Contract No. W-7405-ENG-36 awarded by the U.S. Department of Energy. The government has certain rights in the invention.

FIELD OF THE INVENTION

The present invention relates to pumping of light emitters and more particularly to non-contact pumping of light emitters via non-radiative energy transfer. Additionally, the present invention relates to devices for utilizing such non-contact pumping.

BACKGROUND OF THE INVENTION

Because of the effects of quantum-confinement, the emission color of semiconductor nanocrystals (NCs) can be modified dramatically by simply changing NC size. Spectral tunability, large photoluminescence (PL) quantum yields, and high photostability make NCs attractive for applications in such light-emitting technologies as displays, fluorescence tagging, solid-state lighting, and lasing. An important concern associated with light-emitting applications of NCs is the difficulty in achieving electrical pumping. Thus far, all attempts to directly contact NCs electrically have met with limited success, largely due to the presence of an insulating organic capping layer. Here the indirect exciton injection into NCs is explored via a non-contact, non-radiative energy transfer (ET) from a proximal quantum well (QW) that can be pumped either electrically or optically. Our theoretical treatment and direct experimental measurements indicate that this transfer is fast enough to compete with exciton recombination in the QW and results in greater than 50% QW-to-NC ET efficiencies in the tested devices. Furthermore, the measured ET rates are sufficiently large to provide NC pumping not only in the spontaneous but also in the stimulated emission regime, indicating the feasibility of ET-pumped, NC-based optical amplifiers and lasers.

Several programs worldwide emphasize the need for efficient solid-state emitters in applications ranging from displays and traffic signs to solid-state lighting. Semiconductor nanocrystals (NCs) have been considered promising nanoscale color-selectable emitters that combine high photoluminescence (PL) quantum yields with chemical flexibility and processibility. Such quantum yields (QY) may potentially be as high as 100%. Even in the form of a single monolayer NCs can produce significant power outputs on the order of Watts per cm$^2$ (estimated value for an NC packing density of $10^{12}$ cm$^{-2}$, a radiative lifetime of 20 ns, and a moderate QY of 20%).

One approach to NC-based, electrically pumped light emitting devices utilizes hybrid organic/inorganic structures, in which the charges are delivered to NCs via the organic network and/or percolated NC subsystem. The performance of these devices is, however, limited by low carrier mobilities in both the organic and NC components and by the poor stability of organic molecules with respect to photooxidation.

Despite the gradual progress, problems have remained. After long and careful research, a new approach has now been developed for the pumping of light emitters via non-radiative energy transfer.

SUMMARY OF THE INVENTION

In accordance with the purposes of the present invention, as embodied and broadly described herein, the present invention provides a light emitting device including a primary light source having a defined emission photon energy output, and, semiconductor nanocrystals situated in close proximity to said primary light source, said semiconductor nanocrystals having an absorption onset equal to or less in photon energy than the emission photon energy output of the primary light source whereby non-radiative energy transfer from said primary light source to said light emitting material can occur yielding light emission from said light emitting material.

The present invention still further provides a light emitting diode including an injection layer including colloidal nanocrystals embedded in an semiconductor material selected from the group consisting of a p-type semiconductor and a n-type semiconductor.

The present invention still further provides a method of noncontact nonradiative energy transfer into semiconductor nanocrystals including forming a structure with a layer of semiconductor nanocrystals proximately situated near a primary light source, said semiconductor nanocrystals having an absorption onset equal to or less in photon energy than the emission photon energy output of the primary light source whereby non-radiative energy transfer from said primary light source to said light emitting material can occur, and pumping the primary light source whereby a non-radiative energy transfer from the primary light source to the semiconductor nanocrystals occurs, said non-radiative energy transfer sufficient to result in an output of light from said semiconductor nanocrystalline layer.

DETAILED DESCRIPTION

The present invention is concerned with light emitting devices and to a manner of non-contact pumping of light emitters by non-radiative energy transfer. The present invention is further concerned with light emitting devices including semiconductor nanocrystals.

A "noncontact" approach to carrier injection into NCs has now been developed using Förster-type non-radiative energy transfer (ET) from a proximally situated primary light source such as an epitaxial quantum well (QW). Since ET relies on Coulomb interactions rather than a direct wavefunction overlap, it is not significantly inhibited by any NC capping layer, and can potentially allow for an efficient energy flow from such a QW to NCs. In an optimal device, the QW can be pumped electrically in the same way a common QW light emitting diode is pumped. However, in the initial experiments, pulsed optical excitation was intentionally used in order to study the dynamics of ET as well as the dynamics of other competing processes such as carrier recombination in the QW.

Non-radiative energy transfer (also called Förster-type or resonant energy transfer) is a process in which excitation energy is transferred from a donor to an acceptor as a result of near-field dipole-dipole interaction. The process can be highly efficient at short distances between the donor and acceptor and falls off very rapidly with increasing donor-acceptor separation. Non-radiative energy transfer also requires spectral overlap of the donor emission with the acceptor absorption, but does not involve the emission of a photon by the primary light source.

As used herein, the term "nanocrystal" refers to particles less than about 150 Angstroms in the shortest axis, and preferably from about 10 to about 150 Angstroms. Also, within a particularly selected semiconductor nanocrystal, the semiconductor nanocrystals are substantially monodisperse, i.e., the particles have substantially identical size and shape.

The semiconductor nanocrystals are generally members of a crystalline population having a narrow size distribution. In preferred embodiments, the semiconductor nanocrystals are characterized by a size distribution in rms of less than about 10 percent. The shape of the semiconductor nanocrystals can be a sphere, a rod, a disk and the like.

In one embodiment, the semiconductor nanocrystals include a core of a binary semiconductor material, e.g., a core of the formula MX, where M can be cadmium, zinc, mercury, aluminum, lead, tin, gallium, indium, thallium, magnesium, calcium, strontium, barium, copper, and mixtures or alloys thereof and X is sulfur, selenium, tellurium, nitrogen, phosphorus, arsenic, antimony or mixtures thereof. In another embodiment, the semiconductor nanocrystals include a core of a ternary semiconductor material, e.g., a core of the formula $M_1M_2X$, where $M_1$ and $M_2$ can be cadmium, zinc, mercury, aluminum, lead, tin, gallium, indium, thallium, magnesium, calcium, strontium, barium, copper, and mixtures or alloys thereof and X is sulfur, selenium, tellurium, nitrogen, phosphorus, arsenic, antimony or mixtures thereof. In another embodiment, the semiconductor nanocrystals include a core of a quaternary semiconductor material, e.g., a core of the formula $M_1M_2M_3X$, where $M_1$, $M_2$ and $M_3$ can be cadmium, zinc, mercury, aluminum, lead, tin, gallium, indium, thallium, magnesium, calcium, strontium, barium, copper, and mixtures or alloys thereof and X is sulfur, selenium, tellurium, nitrogen, phosphorus, arsenic, antimony or mixtures thereof. Examples include cadmium sulfide (CdS), cadmium selenide (CdSe), cadmium telluride (CdTe), zinc sulfide (ZnS), zinc selenide (ZnSe), zinc telluride (ZnTe), mercury sulfide (HgS), mercury selenide (HgSe), mercury telluride (HgTe), aluminum nitride (AlN), aluminum sulfide (AlS), aluminum phosphide (AlP), aluminum arsenide (AlAs), aluminum antimonide (AlSb), lead sulfide (PbS), lead selenide (PbSe), lead telluride (PbTe), gallium arsenide (GaAs), gallium nitride (GaN), gallium phosphide (GaP), gallium antimonide (GaSb), indium arsenide (InAs), indium nitride (InN), indium phosphide (InP), indium antimonide (InSb), thallium arsenide (TlAs), thallium nitride (TlN), thallium phosphide (TlP), thallium antimonide (TlSb), zinc cadmium selenide (ZnCdSe), indium gallium nitride (InGaN), indium gallium arsenide (InGaAs), indium gallium phosphide (InGaP), aluminum indium nitride (AlInN), indium aluminum phosphide (InAlP), indium aluminum arsenide (InAlAs), aluminum gallium arsenide (AlGaAs), aluminum gallium phosphide (AlGaP), aluminum indium gallium arsenide (AlInGaAs), aluminum indium gallium nitride (AlInGaN) and the like, mixtures of such materials, or any other semiconductor or similar materials. The preferred semiconductor nanocrystals are from the group of ZnS, ZnSe, ZnTe, CdS, CdSe, CdTe, PbS, PbSe and PbTe.

Additionally, the core of semiconductor material can have an overcoating on the surface of the core. The overcoating can also be a semiconductor material, such an overcoating having a composition different than the composition of the core. The overcoat on the surface of the semiconductor nanocrystals can include materials selected from among Group II-VI compounds, Group II-V compounds, Group III-VI compounds, Group III-V compounds, Group IV-VI compounds, Group I-III-VI compounds, Group II-IV-V compounds, and Group II-IV-VI compounds. Examples include cadmium sulfide (CdS), cadmium selenide (CdSe), cadmium telluride (CdTe), zinc sulfide (ZnS), zinc selenide (ZnSe), zinc telluride (ZnTe), mercury sulfide (HgS), mercury selenide (HgSe), mercury telluride (HgTe), aluminum nitride (AlN), aluminum phosphide (AlP), aluminum arsenide (AlAs), aluminum antimonide (AlSb), gallium arsenide (GaAs), gallium nitride (GaN), gallium phosphide (GaP), gallium antimonide (GaSb), indium arsenide (InAs), indium nitride (InN), indium phosphide (InP), indium antimonide (InSb), thallium arsenide (TlAs), thallium nitride (TlN), thallium phosphide (TlP), thallium antimonide (TlSb), lead sulfide (PbS), lead selenide (PbSe), lead telluride (PbTe), zinc cadmium selenide (ZnCdSe), indium gallium nitride (InGaN), indium gallium arsenide (InGaAs), indium gallium phosphide (InGaP), aluminum indium nitride (AlInN), indium aluminum phosphide (InAlP), indium aluminum arsenide (InAlAs), aluminum gallium arsenide (AlGaAs), aluminum gallium phosphide (AlGaP), aluminum indium gallium arsenide (AlInGaAs), aluminum indium gallium nitride (AlInGaN) and the like, mixtures of such materials, or any other semiconductor or similar materials. The overcoating upon the core material can include a single shell or can include multiple shells for selective tuning of the properties. The multiple shells can be of differing materials.

The semiconductor nanocrystals can be dispersed within a suitable host material. The host matrix may be any material in which the semiconductor nanocrystals may be dispersed in a configuration in which they may be illuminated by the primary light source. Some examples of host matrix materials are polymers such as polystyrene, polyimide, or epoxy, as well as silica glasses, titania glasses, silica sol-gels or titania sol-gels. For the non-radiative energy transfer contemplated by the present invention, the semiconductor nanocrystals are situated within a close proximity of the primary light source, a distance generally less than about 15 nanometers (nm), preferably from about 1 to about 10 nm.

In another aspect of the invention, the light emitting material can be any material, e.g., an organic light emitting molecule or organic light emitting polymer having fluorescent properties, including, but not limited to, molecules such as an aluminum quinolinol complex (generally abbreviated $Alq_3$) or derivative thereof, benzoxazole materials, and benzothiazole materials, or polymers such as substituted and unsubstituted forms of conjugated polymers such as poly(p-phenylene vinylene), poly(silyl-phenylene vinylene), poly(thienylene vinylene), poly(naphthalene vinylene), poly(quinoline vinylene), poly(pyridine vinylene), poly(fluorene), poly(thiophene), derivatives thereof and the like.

In a device of the present invention, a light source can include a primary light source and semiconductor nanocrystals as secondary phosphors. The semiconductor nanocrystals can convert the entire or part of the primary emission (from the primary light source) to emission having a wavelength output from the semiconductor nanocrystals. In the present invention, the conversion process relies on non-radiative (resonant) energy transfer, which is efficient for the small separation between the primary light source (donor) and the semiconductor nanocrystals or secondary phosphors (acceptors). The primary light source can be a semiconductor light emitting diode (LED), a laser diode (LD), an organic light emitting diode (OLED) or may be other types of semiconductor nanocrystals. The primary light source can be either electrically pumped, optically pumped or both. The semiconductor nanocrystals or secondary phosphors can be either mono-disperse in size for narrow band (single pure color) emission or polydisperse in size for multicolor or white light emission. By mono-disperse is generally meant that the semiconductor nanocrystals are characterized by a size distribution in root mean square (rms) deviation in diameter of less than about 10 percent. The semiconductor nanocrystals or secondary phosphors can either emit in the spontaneous emission regime or in the stimulated emission regime as a laser.

Figure 1:
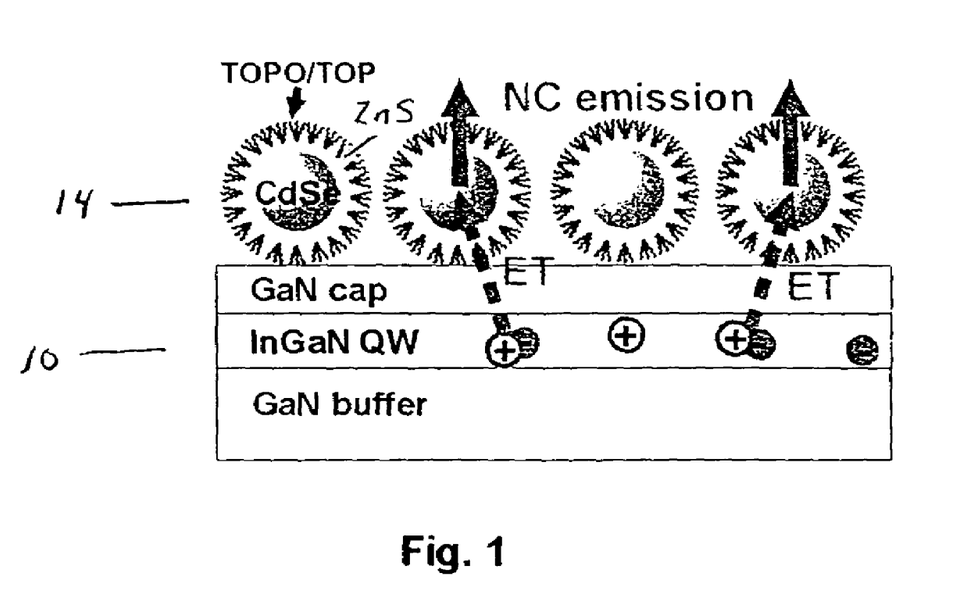
FIG. 1 shows a schematic illustration of a hybrid quantum well/nanocrystal structure including an InGaN/GaN quantum well heterostructure with a monolayer of TOPO/TOP capped CdSe/ZnS core/shell nanocrystals on top of it. Electron-hole pairs generated in the QW can experience non-radiative resonant transfer into the NCs via Förster-type, dipole-dipole interactions. The NCs excited via ET produce emission with a wavelength determined by the NC size.
Figure 2:
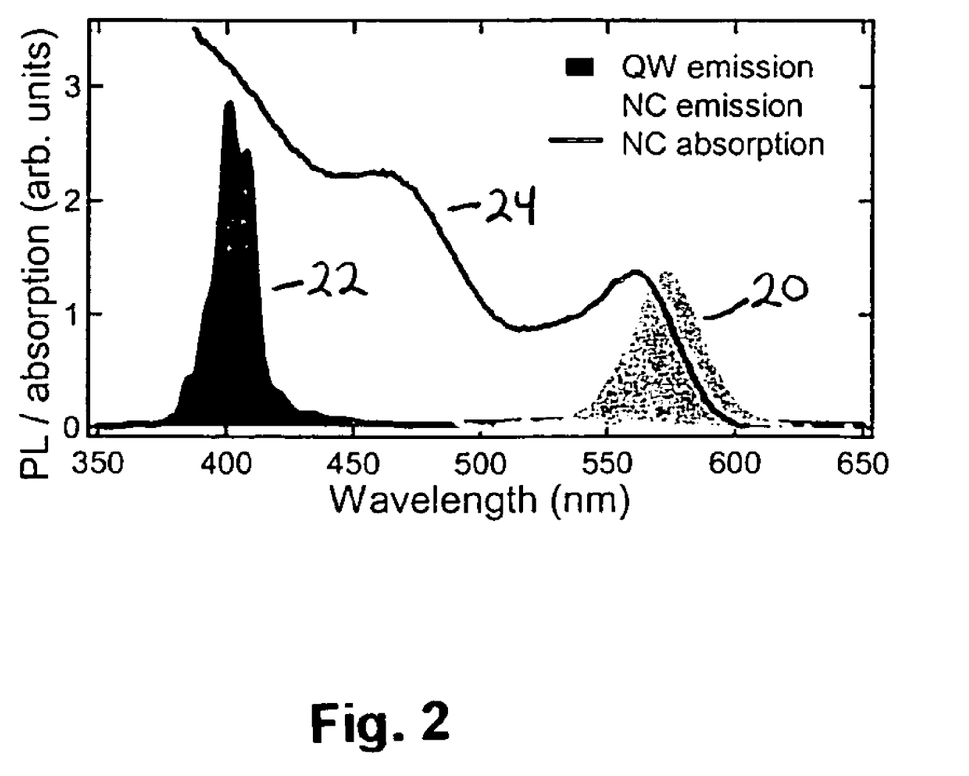
FIG. 2 shows the emission of the QW (dark shaded solid area) spectrally overlaps with the absorption of the NCs (line). For CdSe NCs with 1.9 nm radius, the emission wavelength is around 575 nm (light shaded area).

An exemplary device is schematically depicted in FIG. 1. It consists of an InGaN QW 10 on top of which was assembled a close-packed monolayer 14 of highly monodisperse CdSe/ZnS core/shell NCs using the Langmuir-Blodgett (LB) technique. The NCs are synthesized as described in Dabbousi et al., J. Phys. Chem., 101, 9463-9475 (1997) and are comprised of a CdSe core (radius R=1.9 nm) overcoated with a shell of ZnS (about 0.6 nm thickness), followed by a final layer of the organic molecules of trioctylphosphine (TOP) and trioctylphosphine oxide (TOPO). Either colloidal nanocrystals or nanocrystals epitaxially grown on a substrate can be used in the present invention. FIG. 2 shows the emission of the QW 22 spectrally overlaps with the absorption 24 of the NCs. For CdSe NCs with 1.9 nm radius, the emission wavelength 20 is around 575 nm. These NCs show efficient emission centered near 575 nm and a structured absorption spectrum with the lowest 1S absorption maximum at about 560 nm. QW samples were grown on sapphire substrates by metal-organic chemical vapor deposition by the process described by Koleske et al., Appl. Phys. Lett., 81, 1940-1942 (2002). The QW samples consist of a 20 nm GaN nucleation layer, a 3 μm GaN bottom barrier and a 3 nm InGaN QW that is either terminated with a 3 nm GaN top barrier (capped QW) or remains uncapped (uncapped QW). The concentration of indium in the QWs was 5-10%, which corresponds to an emission wavelength 22 about 400 nm (FIG. 2). This wavelength is in the range of strong NC absorption, which provides strong coupling of QW excitations to the absorption dipole of NCs and should allow efficient ET. To study ET dynamics, the temporal evolution of PL in the QW and the NCs was monitored using a time correlated single-photon counting system that provides about 30 ps time resolution. The hybrid QW/NC structures were excited at 266 nm by 200 fs pulses of the frequency tripled output of an amplified Ti:sapphire laser. The emission from either the QW or the NCs was selected using a monochromator. The dynamics measured for QW/NC hybrid structures were compared with those in isolated QWs and isolated NC monolayers assembled on glass substrates. All measurements were performed at room temperature.

Figure 3:
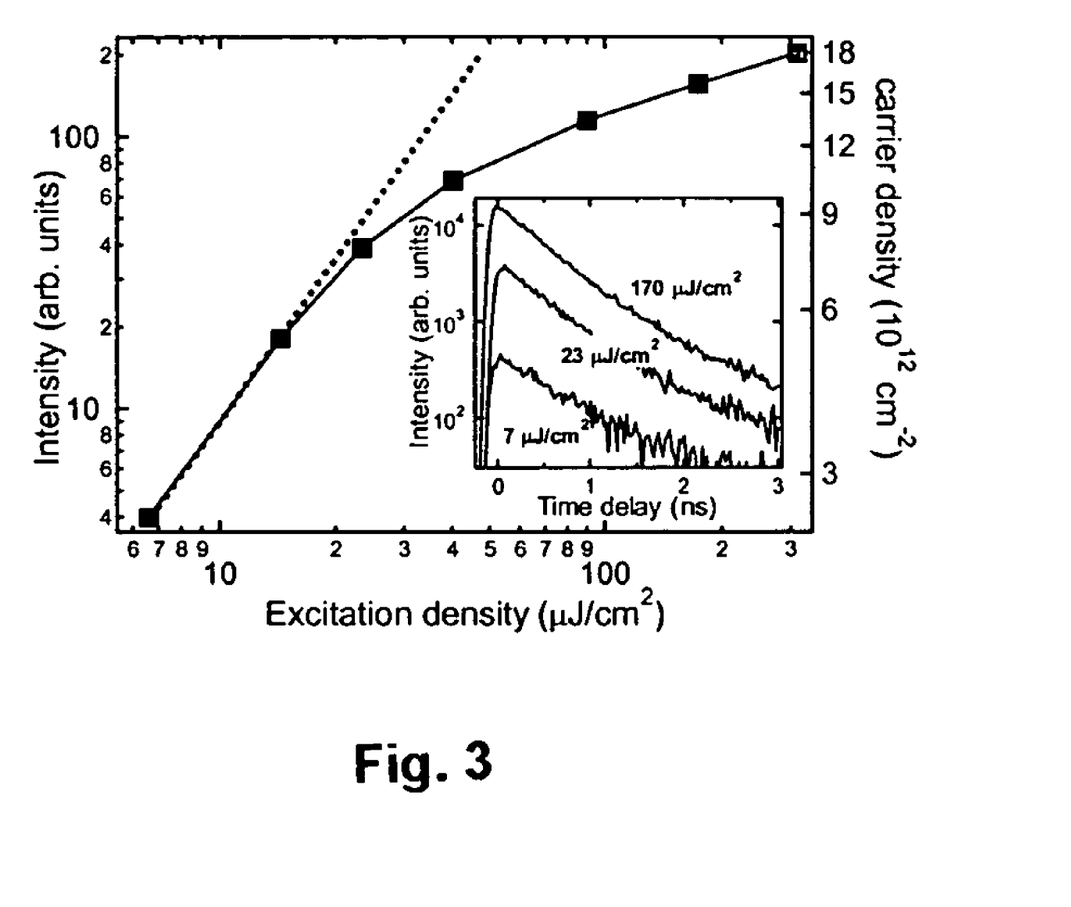
FIG. 3 shows pump and time dependent emission from an isolated QW. The PL intensity of the QW (squares) at zero time delay is plotted as a function of pump fluence. The dotted line is a fit to the quadratic growth at low pump fluences. The inset shows PL dynamics of the isolated QW measured at different pump fluences.

The interactions between the QW and the NC monolayer can be described in terms of a resonant Förster-type ET (similar to that used by Basko et al., Eur. Phys. J. B, 8, 353-362 (1999) to describe ET between a QW and a layer of organic molecules). The ET rate per QW carrier is strongly dependent on whether electrons and holes are free or bound by Coulomb interactions into excitons. In the case of excitons, the ET rate is independent of the density of QW excitations ($n_{eh}$), while in the free-carrier case, the ET rate is proportional to $n_{eh}$ (see Supplementary Information below). To experimentally distinguish between these two cases, the excitation density dependence of PL in an isolated QW at t=0 ps (FIG. 3) was measured. It was observed that at low pump powers this dependence was quadratic, and it saturated at high excitation densities. The quadratic growth of PL was characteristic of free-carrier bimolecular recombination, indicating that the electron-hole (e-h) interactions in these QW samples were not sufficiently strong to produce bound exciton states at room temperature. The PL dynamics in the QW (inset in FIG. 3) were also monitored and it was observed that the PL decay was exponential and was characterized by a time constant range of 0.6-1 ns that was independent of pump power. This result indicates that the decay of photoexcited carriers is dominated not by radiative recombination (characterized by the density-dependent time constant $\tau \propto 1/n_{eh}$) but by trapping at defects, as is typically observed for InGaN QWs at room temperature.

After establishing that QW excitations were unbound electron-hole (e-h) pairs, the ET rate, $\Gamma_{ET}$, per QW carrier could be analyzed using the following expression (see Supplementary Information below):

$$\Gamma_{ET} = \frac{8\pi^2}{3\epsilon^2}|\mu_{NC}|^2|\mu_{QW}|^2 n_{NC} n_{eh} N_{NC}(\hbar\omega_{QW}) \qquad (1)$$

$$\frac{1}{d^4} \frac{\hbar^2}{2Mk_BT} \int_0^\infty \kappa^3 \exp\left(-2\kappa - \frac{\hbar^2\kappa^2}{2Mk_BTd^2}\right) d\kappa,$$

in which $\epsilon$ is the dielectric constant, $\mu_{NC}$ and $\mu_{QW}$ are the transition dipole moments for the NC and the QW, respectively, $n_{NC}$ is the surface density of NCs, $N_{NC}(\hbar\omega_{QW})$ is the NC density of states at the QW emission energy, d is the separation between the centres of the QW and the NC monolayer, M is the sum of electron and hole masses in the QW, and T is the temperature. Assuming that the length of NC passivating molecules is 1.1 nm, values for d of 8.1 and 5.1 nm were obtained for capped and uncapped QWs, respectively, which further results in transfer rates of 1.05 ns$^{-1}$ (capped QW) and 5.8 ns$^{-1}$ (uncapped QW) at a QW carrier density of $1.8 \times 10^{13}$ cm$^{-2}$. These estimated ET rates are sufficiently high to compete with carrier decay rates (about 1 ns$^{-1}$) measured experimentally for the QW samples.

Figure 4:
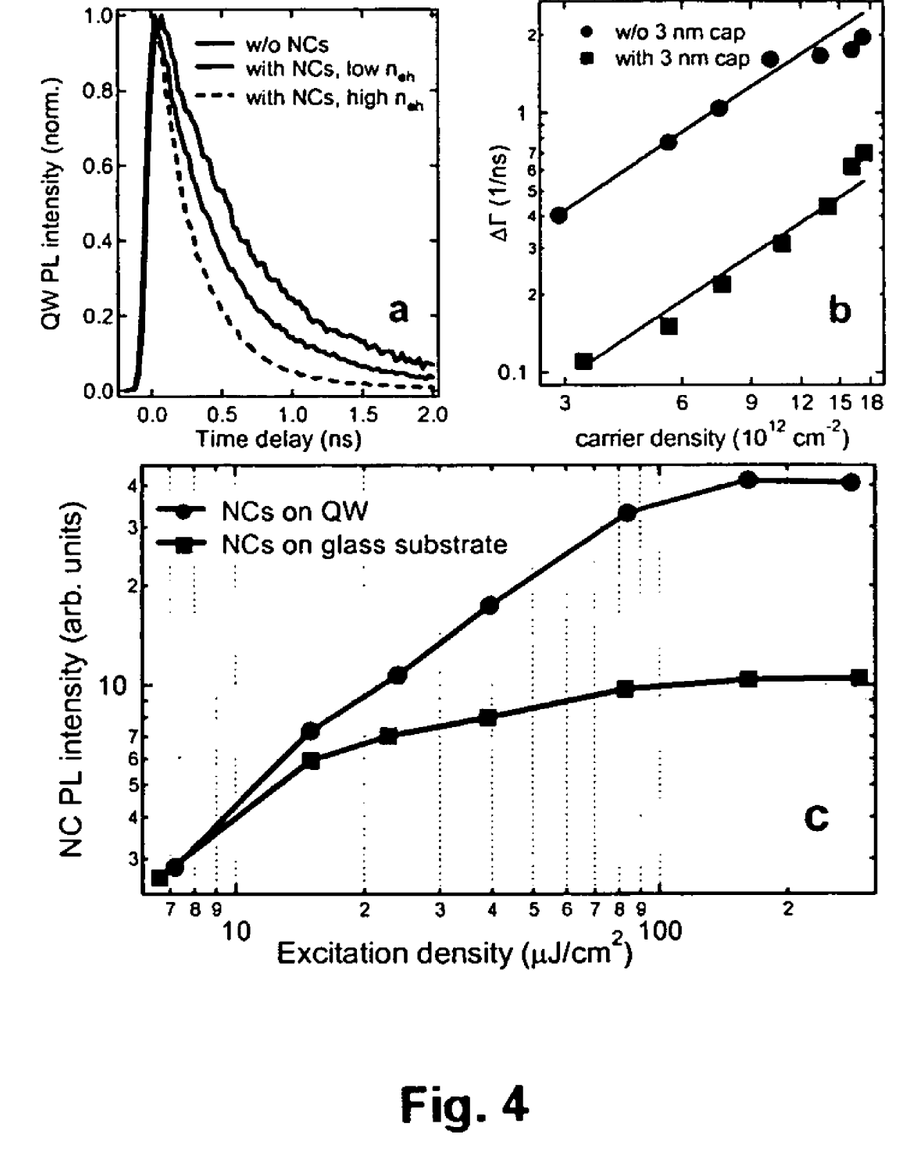
FIGS. 4a-4c show experimental observations of QW-to-NC ET with: 4a showing normalized PL dynamics of the isolated QW (black solid line) at $n_{eh}=3\times10^{12}$ cm$^{-2}$ in comparison to QW PL dynamics measured for the QW/NC structure at $n_{eh}=3\times10^{12}$ cm$^{-2}$ (blue solid line) and $n_{eh}=10\times10^{12}$ cm$^{-2}$ (blue dashed line); 4b showing the difference between the initial PL decay rates measured for the isolated QW and the QW/NC structure ($\Delta\Gamma=\Gamma_{QW\ w/NC}-\Gamma_{QW\ w/o\ NC}$) vs. QW carrier density for samples based on the capped (squares) and the uncapped QW (solid circles); and, 4c showing time-integrated NC PL intensity vs. pump fluence for the NC monolayer assembled on a glass substrate (squares) and on top of a capped QW (solid circles).

To directly measure the QW-to-NC ET rates, comparative, time-resolved PL studies were performed for hybrid QW/NC structures and isolated QWs. It was observed that the presence of the NC layer adjacent to the QW significantly altered the QW PL dynamics (see FIG. 4(a)). Namely, the QW PL decay became faster in the presence of NCs, indicating an additional relaxation channel for QW excitations, which is most likely due to QW-to-NC ET. This NC-induced change in QW dynamics became more pronounced with increasing carrier density (e.g., compare traces shown by solid and dashed lines in FIG. 4(a)). To quantify this increase, in FIG. 4(b) the additional initial decay rate $\Delta\Gamma = \Gamma_{QW\ w/NC} - \Gamma_{Q\ w/o\ NC}$ was plotted as a function of $n_{eh}$ for structures based on uncapped (squares) and capped (circles) QWs. It was observed that in both cases the $\Delta\Gamma$ growth was linear with $n_{eh}$, but absolute values of $\Delta\Gamma$ were approximately 4.4 times greater for the uncapped QWs compared to QWs with a top barrier. Both of these observations are consistent with the fact that the additional decay rate $\Delta\Gamma$ is due to QW-to-NC ET. Förster modelling [Eq.(1)] predicts that for the free-carrier case the ET rate should increase linearly with $n_{eh}$, which is exactly the dependence observed experimentally. Furthermore, the increase in the transfer rate in the case of the uncapped QW is consistent with its strong dependence on the ET distance ($\Gamma_{ET} \sim d^{-4}$). From the geometrical parameters of the present system it is estimated that the d dependence should result in a 5.5 increased ET rate, which agrees well with the factor of 4.4 observed experimentally.

Further evidence for efficient QW-to-NC ET is provided by the analysis of the PL from the NC layer. The ET-induced outflow of carriers from the QW should result in a corresponding increase in the emission of the NCs. In the present experimental configuration, however, optical pumping directly generates carriers not only in the QW but also in the NCs. Therefore, in order to extract the ET-induced increase in the NC PL, a side-by-side comparison of PL data was performed for hybrid QW/NC structures and an NC LB monolayer assembled on a glass slide. One such set of data plotted as temporally integrated NC PL intensity vs. pump fluence is displayed in FIG. 4(c). To account for the difference in the NC packing densities for LB films assembled on the QW and the glass slide, a constant scaling factor was introduced which allows matching of PL intensities detected from QW/NC and glass/NC samples at low pump powers, for which ET from the QW is negligible. The data indicate that at low pump fluences, both types of samples show a similar PL pump dependence. However, two traces show distinctly different behavior at higher pump fluences, for which ET starts to play a significant role (see FIG. 4(b)). While emission from the isolated NC layer saturates at about 20 µJ/cm$^2$, the NC PL in the hybrid structure shows a steady growth until about 80 µJ/cm$^2$. As a result of this delayed saturation, the maximum NC PL intensity achievable with the QW/NC structure is 4 times greater than the PL for the NC monolayer on the glass slide. All of these results indicate a strong additional carrier inflow into NCs as a result of ET from the QW.

FIG. 5(a) displays the schematics of ET along with other relaxation processes in the hybrid QW/NC structures studied in this work. Following photoexcitation, carrier thermalization, and cooling, the thermal distribution of free electrons and holes is established in the QW. QW carriers can decay either radiatively (time constant $\tau_{rr}$) or nonradiatively $\tau_{nr}$), or experience ET ($\tau_{ET}$) into a NC. Carriers generated in the NC via resonant QW-to-NC ET have significant access energies as measured with respect to the NC band-gap. Extremely fast intraband relaxation in NCs (sub-ps time scales) rapidly removes carriers from resonance with the QW transition and prevents backtransfer. In well-passivated NCs, relaxed e-h pairs recombine primarily radiatively with a time constant of about 20 ns, emitting a photon with an energy that is determined by the NC size.

The efficiency of nonradiative QW-to-NC ET ($\eta_{ET}$) can be estimated from the expression: $\eta_{ET} = \tau_r (\tau_{ET} + \tau_r)^{-1}$, in which $\tau_r = (1/\tau_{rr} + 1/\tau_{nr})^{-1}$ is the relaxation time of QW excitations due to both radiative and nonradiative process. The experimental results for the uncapped sample indicate that $\tau_r \approx 0.6$ ns and $\tau_{ET} \approx 0.5$ ns (for $n_{eh} = 1.8 \times 10^{13}$ cm$^{-2}$), which yields $\eta_{ET}$ as high as 55%. It is believed that that nearly 100% efficiencies can be achieved by improving the quality of the QWs (to reduce nonradiative losses) and/or by optimizing the geometry of the NC-QW structure (by using, e.g., shorter NC surface passivation molecules).

It is interesting that despite the additional step in the ET process, the PL QY of the hybrid QW/NC device ($QY_{QW/NC}$) can be greater than the original QY of the QW ($QY_{QW}$). $QY_{QW/NC}$ can be estimated from the expression $QY_{QW/NC} = QY_{NC}(1 + \tau_{ET}/\tau_r)^{-1}$, where $QY_{NC}$ is the PL QY of the NCs. This expression indicates that if $\tau_{ET} \ll \tau_r$ the quantum efficiency of the hybrid structure approaches that of NCs. This conclusion further means that even the use of InGaN QWs with poor room temperature QYs can produce highly efficient hybrid devices.

It is illustrative to compare the efficiency of ET measured here with that expected for radiative ET ($\eta_{RET}$). The latter process is used in the traditional colour-conversion scheme and is based on the emission of a photon from a QW followed by absorption/re-emission steps in the phosphor material (e.g., NCs or other phosphors such as organic dyes). For a close-packed NC monolayer, $\eta_{RET}$ can be estimated from the ratio of the NC absorption cross section to its geometrical cross section, which yields $\eta_{RET} < 0.3\%$. This value is at least two orders of magnitude smaller than the efficiencies measured experimentally, indicating that the use of nonradiative ET can significantly improve the performance of color-conversion devices.

In addition to applications as efficient color converters, NCs have been considered promising building blocks for color-selectable optical gain media in lasing applications. One complication associated with lasing applications of NCs is the requirement for extremely fast pumping that competes with non-radiative Auger recombination leading to very short (picosecond) optical gain lifetimes. So far optical amplification and lasing in NCs has been achieved using optical excitation with short laser pulses. Estimations show that the "ET pumping" scheme studied here provides carrier inflow that can in principle compete with nonradiative losses induced by Auger recombination. The ET rate of about 2 ns$^{-1}$ measured for the uncapped QW sample for $n_{eh} = 1.8 \times 10^{13}$ cm$^{-2}$ results in the QW-to-NC carrier flux of about $3.6 \times 10^{22}$ cm$^{-2}$s$^{-1}$. For the NCs of 1.9 nm radius as described here, the Auger recombination time is about 50 ps, which corresponds to a nonradiative carrier loss of $4 \times 10^{22}$ cm$^{-2}$s$^{-1}$ for a close-packed monolayer. The latter value is comparable to the carrier inflow rate provided by ET from the QW, indicating the feasibility of lasing in the ET pumping regime.

Figure 5:
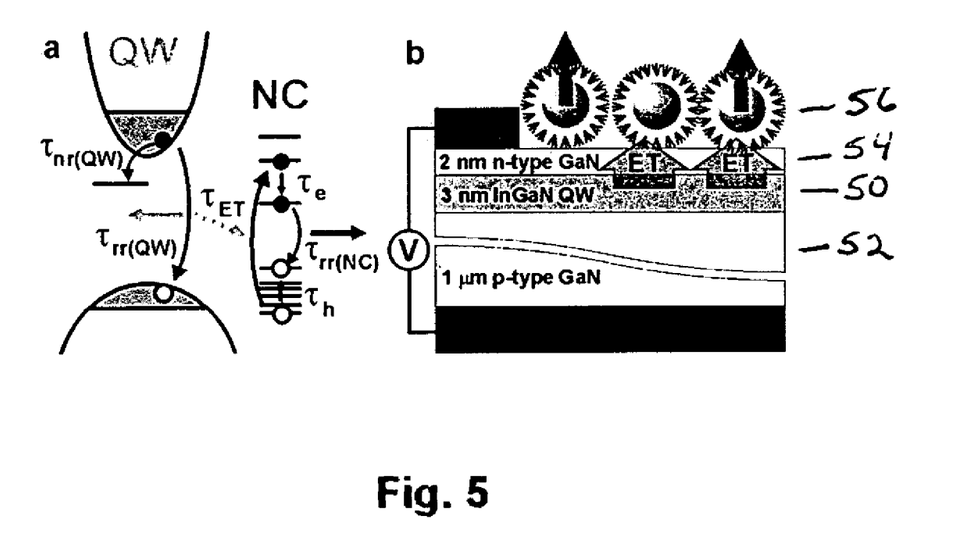
FIGS. 5a-5b show carrier relaxation and ET processes in the QW/NC structure, and a schematic of an electrically powered hybrid QW/NC structure with: 5a showing the QW-to-NC ET competes with radiative and nonradiative decay processes in the QW. High-energy excitations created in the NCs via ET rapidly relax to the NC band edge, which prevents backtransfer; and, 5b showing a schematic illustration of a device that can be used to realize the "ET color converter" in the regime of electrical injection. It depicts an InGaN QW sandwiched between bottom p-type and thin, top n-type GaN barriers with attached metal contacts. The top contact only partially covers the QW and leaves open space for assembling the NCs.

While only optically pumped devices have been studied, it should be possible to realize the ET pumping scheme in the regime of electrical injection by combining NCs 56 with an electrically driven GaInN QW. The design of the QW emitter in the "ET color-converter" (see FIG. 5(*b*)) can be similar to that used in conventional GaInN light emitting diodes, in which the QW 50 is sandwiched between n and p doped GaN barriers 52 and 54 with attached metal contacts. These preliminary studies indicate that fabrication of high mobility (about 200 cm$^2$V$^{-1}$s$^{-1}$), thin (2-3 nm), n-doped GaN layers that can be used as top QW barriers (adjacent to NCs) in electrically powered devices can be constructed. The direct comparison of PL dynamics in NCs assembled on glass slides and n-doped GaN layers (up to 2×10$^{19}$ cm$^{-3}$ doping level) do not show any noticeable quenching of NC emission in the presence of a proximal doped semiconductor. Furthermore, the doping of the barriers is not expected to induce additional carrier losses in the QW. All of these considerations strongly indicate the feasibility of high-efficiency, electrically driven, hybrid NC/QW devices.

Figure 6:
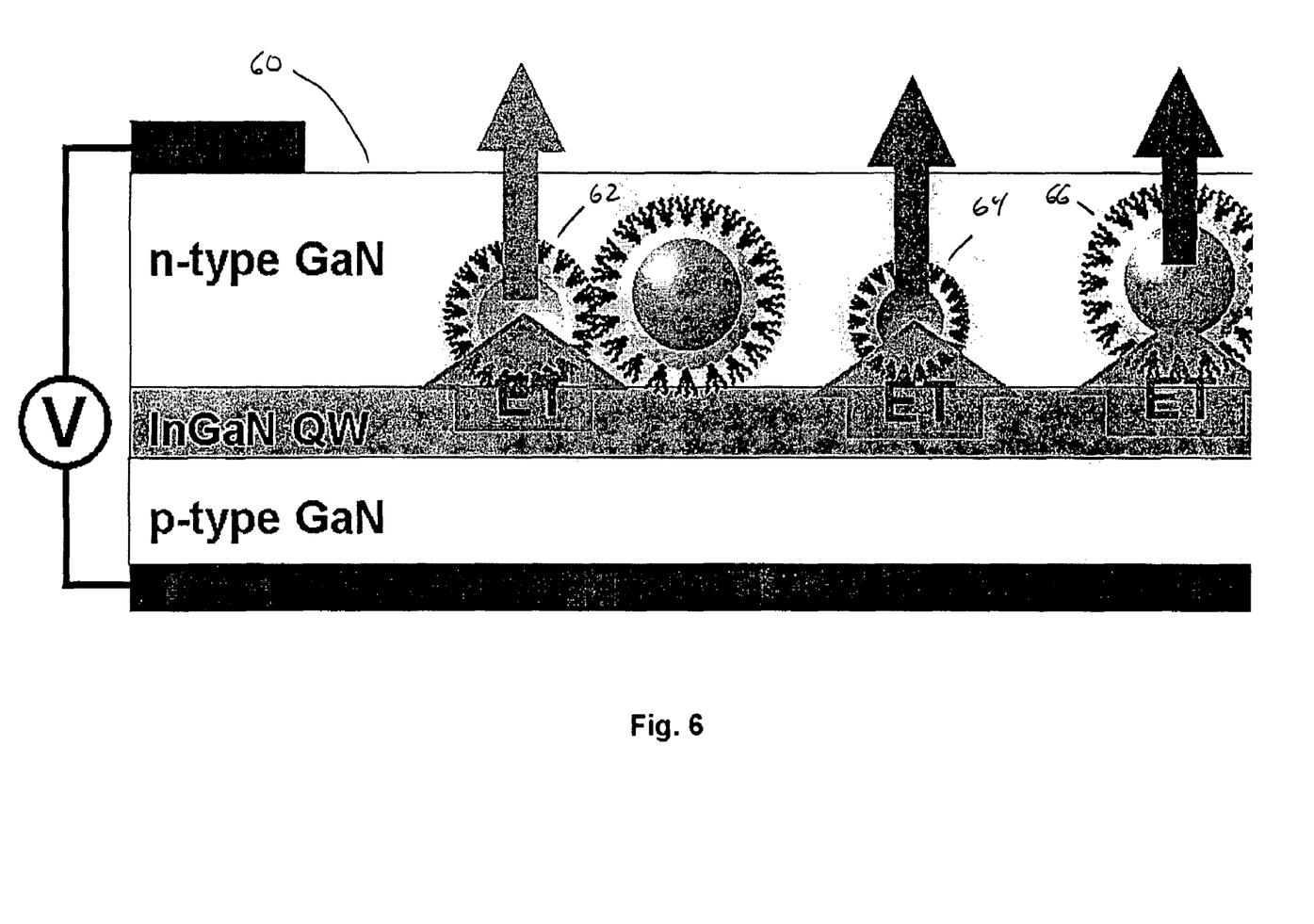
FIG. 6 shows a device with an injection layer including colloidal nanocrystals embedded in a semiconductor material.

FIG. 6 shows a device with an injection layer 60 including colloidal nanocrystals embedded in a semiconductor material 62. Various size of the semiconductor nanocrystals 62, 64 and 66 yield differing colors of light output.

Supplemental Information

The approach to calculating the energy transfer (ET) rate, $\Gamma_{ET}$, between a semiconductor quantum well (QW) and a monolayer of semiconductor nanocrystals (NCs) is conceptually similar to that used by Basko et al. to describe ET between the QW and a layer of organic molecules.

The Förster process transfers an electron-hole (e-h) excitation from the QW to the NC via electrostatic interactions that we describe in the dipolar approximation. The transition rate is calculated using the Fermi Golden rule, in which the summation is performed over the final states in the NC monolayer and the QW initial states weighted using the thermal distribution function. The two cases that correspond to two different types of excitations in the QW: coulombically bound e-h pairs (excitons) and free electrons and holes are distinguished between as follows.

First, ET in the excitonic regime: The QW exciton envelope function is presented as a product of the functions that describe the centre-of-mass (cm) motion and the relative (rel) motion:

$$\Psi(r_e, r_h) = \Psi_{cm}(r_{cm})\Psi_{rel}(r_{rel}), \text{ with } \Psi_{cm}(r_{cm}) \propto e^{iKr_{cm}} \text{ and } \Psi_{rel}(r) \propto e^{-\frac{r}{a_B}},$$

where K is the centre-of-mass momentum and $\alpha_B$ is the exciton Bohr radius. To calculate the Förster transfer rate, the Boltzman distribution of QW excitons is assumed, which yields:

$$\Gamma_{ET}^{exc} = \frac{16\pi}{3\varepsilon^2}|\mu_{NC}|^2|\mu_{QW}|^2 n_{NC} \frac{1}{a_B^2} \qquad (1)$$

$$N_{NC}(\hbar\omega_{QW})\frac{1}{d^4}\frac{\hbar^2}{2Mk_BT}\int_0^\infty \kappa^3 e^{-2\kappa-\frac{\hbar^2\kappa^2}{2Mk_BTd^2}} d\kappa,$$

where $\varepsilon$ is the effective dielectric constant (see below), $\mu_{NC}$ and $\mu_{QW}$ are the transition dipole moments for the NCs and the QW, respectively, $n_{NC}$ is the surface density of NCs, $N_{NC}(\hbar\omega_{QW})$ is the NC density of states at the QW emission energy, d is the separation between the centres of the QW and the NC monolayer, M is the sum of electron and hole masses in the QW, and T is the temperature.

Second, ET in the free-carrier regime: In the free-carrier case, QW electrons and holes are described by plane waves and follow the same procedure as the one described above to calculate the ET rate. At sufficiently high temperatures, which correspond to a nondegenerate electron/hole gas, it is found that:

$$\Gamma_{ET}^{e-h} = \frac{8\pi^2}{3\varepsilon^2}|\mu_{NC}|^2|\mu_{QW}|^2 n_{NC} n_{eh} \qquad (2)$$

$$N_{NC}(\hbar\omega_{QW})\frac{1}{d^4}\frac{\hbar^2}{2Mk_BT}\int_0^\infty \kappa^3 e^{-2\kappa-\frac{\hbar^2\kappa^2}{2Mk_BTd^2}} d\kappa,$$

where $n_{eh}$ is the carrier density in the QW.

The important difference between Eqs.(1) and (2) is that in the excitonic case the ET rate is independent of $n_{eh}$, whereas in the free-carrier case it is proportional to $n_{eh}$. From photoluminescence (PL) studies of isolated QWs, it was concluded that the QW excitations at room temperature can be described in terms of free (unbound) e-h pairs. Using Eq.(2), ET rates of 1.05 ns$^{-1}$ (capped QW) and 5.8 ns$^{-1}$ (uncapped QW) were obtained for the following set of parameters:

$\varepsilon$=3.6 [the value of the effective dielectric constant is obtained by averaging the high frequency dielectric constant of GaN ($\varepsilon$=6.2) and the dielectric constant of air ($\varepsilon$=1)], $\mu_{NC}$=25 Debye (as in Crooker et al., "Spectrally resolved dynamics of energy transfer in quantum-dot assemblies: Towards engineered energy flows in artificial materials", *Phys. Rev. Lett.* 89, 186802 (2002)), $\mu_{QW}$=14 Debye (as in Lawaetz, "Valence-band parameters in cubic semiconductors", *Phys. Rev. B* 4, 3460 (1971))

$n_{NC}$=2×10$^{12}$ cm$^{-2}$ (determined for a close-packed monolayer of NCs with $r_{total}$=3.6 nm), $n_{eh}$=1.8×10$^{13}$ cm$^{-2}$, $N_{NC}(\hbar\omega_{QW})$=17.3 eV$^{-1}$ (determined from the measured NC absorption spectra), $m_e$=0.2 $m_0$, $m_h$=0.8 $m_0$,

T=293 K, d=5.1 nm (uncapped QW) and d=8.1 nm (capped QW).

Although the present invention has been described with reference to specific details, it is not intended that such details should be regarded as limitations upon the scope of the invention, except as and to the extent that they are included in the accompanying claims.

What is claimed is:

1. A light emitting device comprising:
   a primary excitation source having a defined transition energy output; and,
   a layer of light emitting material proximately situated near said primary excitation source, said light emitting material having an absorption onset equal to or less in transition energy than the transition energy output of the primary excitation source whereby non-radiative energy transfer from said primary excitation source to said light emitting material can occur yielding light emission from said light emitting material.

2. The device of claim 1 wherein said layer of light emitting material is within about 15 nanometers of said primary excitation source.

3. A light emitting device comprising:
a primary excitation source having a defined transition energy output; and, a light emitting material proximately situated near said primary excitation source, said light emitting material having an absorption onset equal to or less in transition energy than the transition energy output of the primary excitation source whereby non-radiative energy transfer from said primary excitation source to said light emitting material can occur yielding light emission from said light emitting material; wherein said primary excitation source is selected from the group consisting of a semiconductor light emitting diode, a laser diode, an organic light emitting diode, and semiconductor nanocrystals.

4. The device of claim 3 wherein said primary excitation source is either electrically pumped or optically pumped.

5. The device of claim 3, wherein said primary excitation source is a semiconductor light emitting diode comprising at least one material selected from the group consisting of GaN, InGaN, AlGaN, GaAs, AlGaAs and InGaAs.

6. The device of claim 1 wherein said light emitting material is selected from the group consisting of semiconductor nanocrystals, organic light emitting molecules and organic light emitting polymers.

7. The device of claim 3 wherein said light emitting material comprises semiconductor nanocrystals selected from the group consisting of $M_1X$, $M_1M_2X$, and $M_1M_2M_3X$, where $M_1$, $M_2$, and $M_3$ are each selected from the group consisting of Zn, Cd, Hg, Al, Ga, In, Tl, Pb, Sn, Mg, Ca, Sr, Ba, mixtures and alloys thereof and X is selected from the group consisting of S, Se, Te, As, Sb, N, P and mixtures thereof.

8. The device of claim 3 wherein said light emitting material comprises semiconductor nanocrystals are selected from the group consisting of ZnS, ZnSe, ZnTe, CdS, CdSe, CdTe, PbS, PbSe and PbTe.

9. The device of claim 3 wherein said primary excitation source is a semiconductor quantum well on a substrate of a material selected from the group consisting of sapphire, silicon carbide and silicon.

10. The device of claim 7 wherein said semiconductor nanocrystals are either a layer of colloidal nanocrystals or a layer of epitaxially formed semiconductor nanocrystals.

11. The device of claim 7 wherein said semiconductor nanocrystals are characterized by a size distribution in rms of less than about 10 percent.

12. The device of claim 7 wherein said semiconductor nanocrystals include a mixture of different size semiconductor nanocrystals.

13. The device of claim 12 wherein each different size semiconductor nanocrystals is characterized by a size distribution in rms of less than about 10 percent.

14. The device of claim 7 wherein said semiconductor nanocrystals are within a host matrix.

15. The device of claim 14 wherein said host matrix is selected from the group consisting of polystyrene, polyimide, epoxy, silica glasses, titania glasses, silica sol-gels or titania sol-gels.

16. A method of non-contact non-radiative energy transfer into a light emitting material comprising:
forming a structure with a layer of light emitting material proximately situated near a primary excitation source, said light emitting material having an absorption onset equal to or less in transition energy than the transition energy output of the primary excitation source whereby non-radiative energy transfer from said primary excitation source to said light emitting material can occur; pumping the primary excitation source whereby a non-radiative energy transfer from the primary excitation source occurs, said non-radiative energy transfer sufficient to result in a output of light from said light emitting material layer.

17. The method of claim 16 wherein said light emitting material is selected from the group consisting of semiconductor nanocrystals, organic light emitting molecules and organic light emitting polymers.

18. The method of claim 16 wherein said light emitting material is within about 15 nanometers of said primary excitation source.

19. A light emitting device comprising:
a semiconductor quantum well as a primary excitation source; and,
semiconductor nanocrystals as a light emitting material, said semiconductor nanocrystals proximately situated within about 15 nanometers of said semiconductor quantum well, said semiconductor nanocrystals having an absorption onset equal to or less in transition energy than the transition energy output of the semiconductor quantum well whereby non-radiative energy transfer from said semiconductor quantum well to said semiconductor nanocrystals yields light emission from said semiconductor nanocrystals.

20. The device of claim 19 wherein said light emitting material comprises semiconductor nanocrystals selected from the group consisting of $M_1X$, $M_1M_2X$, and $M_1M_2M_3X$, where $M_1$, $M_2$, and $M_3$ are each selected from the group consisting of Zn, Cd, Hg, Al, Ga, In, Tl, Pb, Sn, Mg, Ca, Sr, Ba, mixtures and alloys thereof and X is selected from the group consisting of S, Se, Te, As, Sb, N, P and mixtures thereof.

21. The device of claim 19 wherein said light emitting material comprises semiconductor nanocrystals are selected from the group consisting of ZnS, ZnSe, ZnTe, CdS, CdSe, CdTe, PbS, PbSe and PbTe.

22. The device of claim 3 wherein said light emitting material is within about 15 nanometers of said primary excitation source.

23. The device of claim 3 wherein said light emitting material is selected from the group consisting of semiconductor nanocrystals, organic light emitting molecules and organic light emitting polymers.

24. The device of claim 1 wherein said primary excitation source is selected from the group consisting of a semiconductor light emitting diode, a laser diode, an organic light emitting diode, and semiconductor nanocrystals.

25. The device of claim 24 wherein said primary excitation source is either electrically pumped or optically pumped.

26. The device of claim 1 wherein said primary excitation source is a semiconductor light emitting diode comprising at least one material selected from the group consisting of GaN, InGaN, AlGaN, GaAs, AlGaAs and InGaAs.

27. The device of claim 1 wherein said light emitting material comprises semiconductor nanocrystals selected from the group consisting of $M_1X$, $M_1M_2X$, and $M_1M_2M_3X$, where $M_1$, $M_2$, and $M_3$ are each selected from the group consisting of Zn, Cd, Hg, Al, Ga, In, Ti, Pb, Sn, Mg, Ca, Sr, Ba, mixtures and alloys thereof and X is selected from the group consisting of S, Se, Te, As, Sb, N, P and mixtures thereof.

28. The device of claim 1 wherein said light emitting material comprises semiconductor nanocrystals are selected from the group consisting of ZnS, ZnSe, Ate, CdS, CdSe, CdTe, PbS, PbSe and PbTe.

29. The device of claim 1 wherein said primary excitation source is a semiconductor quantum well on a substrate of a material selected from the group consisting of sapphire, silicon carbide and silicon.

30. The device of claim 27 wherein said semiconductor nanocrystals are either a layer of colloidal nanocrystals or a layer of epitaxially formed semiconductor nanocrystals.

31. The device of claim 27 wherein said semiconductor nanocrystals are characterized by a size distribution in rms of less than about 10 percent.

32. The device of claim 27 wherein said semiconductor nanocrystals include a mixture of different size semiconductor nanocrystals.

33. The device of claim 32 wherein each different size semiconductor nanocrystals is characterized by a size distribution in rms of less than about 10 percent.

34. The device of claim 27 wherein said semiconductor nanocrystals are within a host matrix.

35. The device of claim 34 wherein said host matrix is selected from the group consisting of polystyrene, polyimide, epoxy, silica glasses, titania glasses, silica sol-gels or titania sol-gels.

* * * * *